United States Patent
Lyons et al.

(10) Patent No.: US 7,112,489 B1
(45) Date of Patent: Sep. 26, 2006

(54) NEGATIVE RESIST OR DRY DEVELOP PROCESS FOR FORMING MIDDLE OF LINE IMPLANT LAYER

(75) Inventors: Christopher F. Lyons, Fremont, CA (US); Anna Minvielle, San Jose, CA (US); Marina V. Plat, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 11/004,691

(22) Filed: Dec. 3, 2004

(51) Int. Cl.
   *H01L 21/336* (2006.01)
   *H01L 21/8238* (2006.01)
(52) U.S. Cl. ............ 438/257; 438/201; 438/211
(58) Field of Classification Search ............ None
   See application file for complete search history.

(56) References Cited

U.S. PATENT DOCUMENTS

| | | | |
|---|---|---|---|
| 4,104,070 A | | 8/1978 | Moritz et al. .......... 96/36 |
| 5,403,435 A | * | 4/1995 | Cathey et al. .......... 438/669 |
| 5,480,819 A | * | 1/1996 | Huang .......... 438/263 |
| 5,976,740 A | | 11/1999 | Ausschnitt et al. .......... 430/30 |
| 6,814,879 B1 | * | 11/2004 | Shibata .......... 216/41 |

* cited by examiner

*Primary Examiner*—Michael Lebentritt
*Assistant Examiner*—Cheung Lee
(74) *Attorney, Agent, or Firm*—Renner, Otto, Boisselle & Sklar, LLP

(57) ABSTRACT

A method of implanting a middle of line (MOL) implant layer of a flash memory device that does not require a descumming step is disclosed. In a first embodiment, the method includes depositing a negative tone resist over the MOL implant layer. Portions of the negative tone resist in and above a plurality of trenches are not exposed to optical radiation, while portions surrounding the plurality of trenches are exposed. The unexposed portions are developed out thereby leaving a bottom surface of each trench substantially free of a resist residue. Implants can be placed in the MOL implant layer without the need for a descumming step. In a second embodiment, a bi-layer resist is deposited on the MOL implant layer, wherein the bi-layer resist includes a silicon containing top layer and a bottom layer. The bi-layer resist is patterned to expose a portion of the bottom layer that resides in and above a plurality of trenches. The bottom layer is dry etch developed using oxygen plasma as the etchant, thereby leaving a bottom surface of each trench substantially free of a resist residue. Implants can be placed in the MOL implant layer without the need for a descumming step.

8 Claims, 5 Drawing Sheets

NEGATIVE RESIST OR DRY DEVELOP PROCESS FOR FORMING MIDDLE OF LINE IMPLANT LAYER

TECHNICAL FIELD

The present invention relates generally to the field of integrated circuit manufacture and, more particularly, to a method of avoiding resist residue formation at middle of line implant layers during fabrication of flash memory devices.

BACKGROUND

Floating gate flash memory architecture includes several critical implant layers, which are referred to as middle of line (MOL) implant layers. Referring to FIG. 1, an exemplary middle-of-line (MOL) implant layer 100 of a flash memory device is shown. As is known in the art, MOL implant layers can include numerous trenches 102, which can create a severe topography in a surface of the MOL implant layer. Implantation of the MOL implant layer 100 is performed through openings 106 formed in a resist layer 108, which is deposited over the MOL implant layer 100. Conventionally, positive tone resists are used to protect a top surface 104 of the MOL implant layer, while trench regions are exposed for implantation.

With further reference to FIG. 2A and FIG. 2B, conventional processing steps for forming the resist layer 108 on the MOL implant layer are shown. The trenches 102 are formed initially using conventional techniques. Next, the resist layer 108 is deposited generally over the MOL layer 100, covering the MOL implant layer 100 and filling the trenches 102. Using conventional photolithographic techniques, the resist layer 108 is selectively exposed using optical radiation 110 and a mask 112. The exposed resist subsequently is developed to remove a portion of the resist, e.g., the exposed portion for a positive tone resist. With respect to the MOL implant layer, the desired result is to remove the resist 108 from each trench 102, while retaining the resist along the top surface 104 of the MOL implant layer.

A pervasive trend in modern integrated circuit manufacture is to produce semiconductor devices, such as flash memory devices, that are as small as possible. The reduction in size of the flash memory device results in a surface of the wafer having a severe topography, particularly at the MOL implant layers 100. Additionally, the MOL implant layers tend to be highly reflective, creating problems with CD control. Due in part to the severe topography of the MOL implant layer, some resist residue 114 inevitably remains in the trenches 102 after the resist has been exposed and developed. The residue or "scumming" as it is referred to in the art is difficult to remove from the trenches and can lead to problems during subsequent implantation steps. For example, the residue can block implants and/or cause implant non-uniformity, which can increase the potential for defective memory devices and thus lower yields.

Accordingly, it is desirable that a bottom portion 116 of each trench 102 be free of resist residue prior to implantation. A conventional method of removing resist residue from the trench regions is through an oxygen plasma descumming step, which is performed after the resist has been exposed and developed. In oxygen plasma descumming, the wafer is placed in a chamber having an oxygen plasma atmosphere. The oxygen plasma causes a chemical reaction with surface contaminants on the wafer, e.g., the residue in the trenches, resulting in their volatilization and subsequent removal from the plasma chamber.

A drawback to oxygen plasma descumming is that the resist image on the wafer can be affected by the descum step. For example, during the oxygen plasma descumming step, the resist sidewalls can be partially removed by the oxygen plasma, thereby altering or enlarging openings in the resist layer. Since the resist pattern is altered from its intended image, overlay margin, for example, can be affected.

Accordingly, there exists a need in the art for a method of fabricating MOL implant layers in flash memory devices that minimizes the amount of resist residue left in the trenches of the MOL implant layers. Additionally, it would be advantageous if the descumming step could be eliminated altogether.

SUMMARY OF THE INVENTION

According to one aspect of the invention, a method of implanting a middle of line (MOL) implant layer of a flash memory device is provided. The method includes the steps of: depositing a resist layer over the MOL implant layer, wherein the resist layer is a negative tone resist; exposing a portion of the resist layer to optical radiation, wherein the portion exposed is over a top surface of the MOL implant layer that surrounds a plurality of trenches; developing the resist layer to remove the resist from the plurality of trenches, thereby leaving a bottom surface of each trench substantially free of a resist residue; and implanting the trenches.

A second aspect of the invention is directed to a method of implanting a middle of line (MOL) implant layer of a flash memory device, including the steps of: depositing a bi-layer resist over the MOL implant layer, wherein the bi-layer resist includes a bottom layer and a silicon containing top layer; patterning the silicon containing top layer to expose a portion of the bottom layer in and above a plurality of trenches; dry etching the exposed portion of the bottom layer, thereby leaving a bottom surface of each trench substantially free of a resist residue; and implanting the trenches.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

DISCLOSURE OF INVENTION

Figure 1:
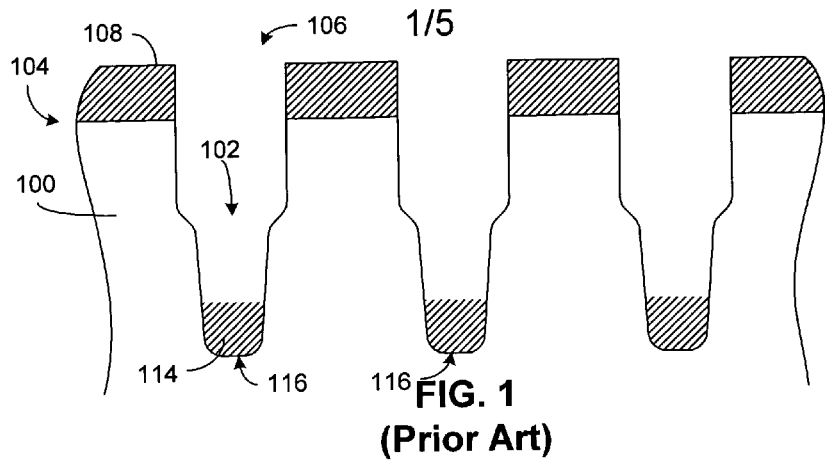
FIG. 1 is a cross section of a middle of line (MOL) implant layer prepared for implantation using conventional techniques.
Figure 2A:
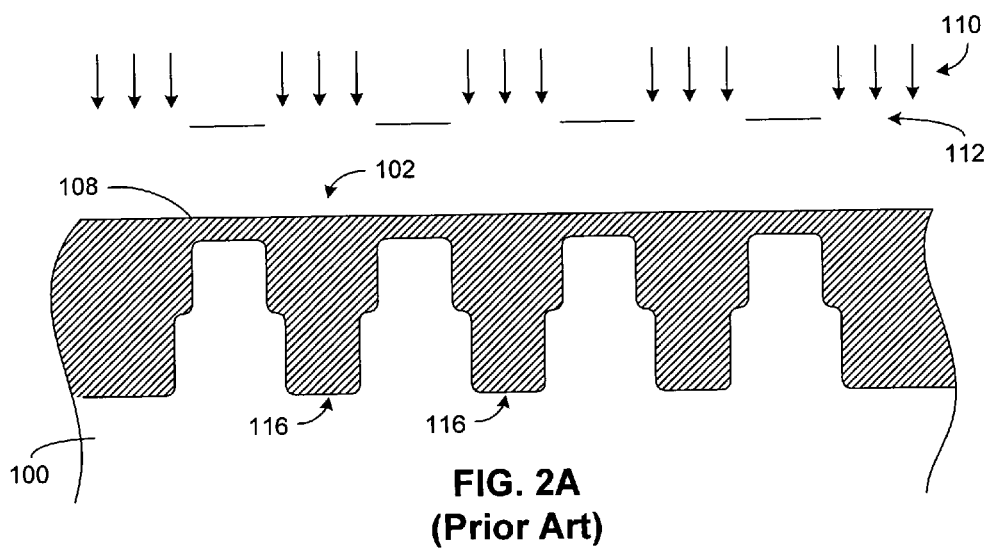
FIG. 2A is a cross-section of the MOL implant layer of FIG. 1 being prepared for implantation during an intermediate stage of fabrication.
Figure 2B:
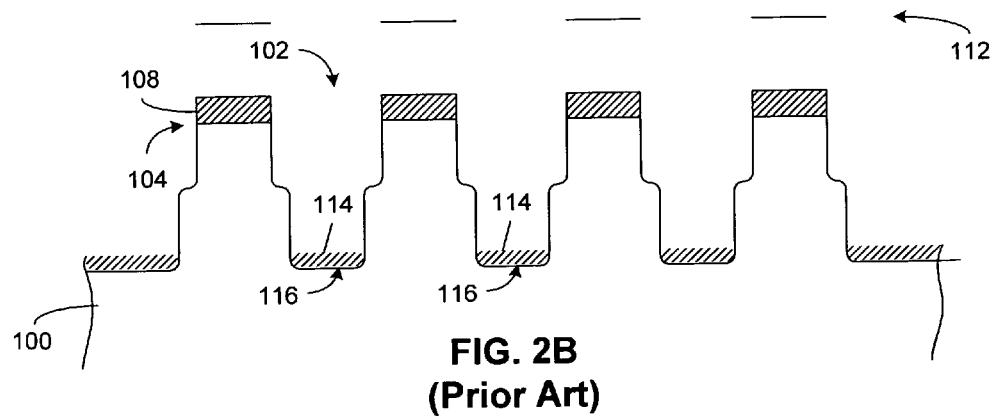
FIG. 2B is a cross-section of the MOL implant layer of FIG. 1 being prepared for implantation during another intermediate stage of fabrication.

In the detailed description that follows, corresponding components have been given the same reference numerals, regardless of whether they are shown in different embodiments of the present invention or at different times during a wafer processing method. To illustrate the present invention in a clear and concise manner, the drawings may not necessarily be to scale.

A method of preparing an MOL implant layer according to the present invention obviates the need for performing a descum step. More specifically, the method of preparing an MOL implant layer according to the present invention creates an MOL implant layer that is substantially free of resist residue after the resist has been developed from the trenches of the MOL implant layer.

In a first embodiment of implanting the MOL implant layer in a flash memory device, a negative tone resist, as opposed to the conventional positive tone resist, is deposited over the MOL implant layer. As is known in the art, the "tone" of a lithographic pattern is determined by the presence or absence of resist material, which is normally deposited in a layer or film on the surface of the wafer to be etched and/or implanted. Patterns are either resist shapes on a clear background or the absence of resist shapes (i.e., spaces) in a background of resist material. Negative tone behavior is demonstrated when the resist layer is subjected to a development treatment with a suitable developer which dissolves away the resist layer in the non-irradiated areas.

Using a mask, the portions of the negative tone resist on the top surface of the MOL implant layer are exposed to optical radiation, while the portions of the negative tone resist within the trenches are not exposed to the optical radiation. Subsequently, the resist is developed in a developer, as is conventional, and the unexposed portions of the resist substantially develop out without leaving a residue. Therefore, a resist residue does not form at the bottom portion of each trench and, thus, a descumming step is not required. Each trench can be implanted after the resist has been developed, without the need for a descumming step.

In a second embodiment of implanting the MOL implant layer in a flash memory device, a positive tone bi-layer resist is implemented. A bi-layer resist includes two resist layers, one deposited above the other. For example, a bottom resist layer is deposited over the MOL implant layer, and the bottom resist layer is cured. After the bottom resist layer has cured, a silicon containing top resist layer is deposited over the bottom resist layer. The silicon containing top resist layer also is cured, and the silicon containing top resist layer then is patterned to expose a portion of the bottom resist layer, e.g., the top resist layer is exposed and developed to remove portions of the top resist layer that are above the trench regions of the MOL implant layer. The bottom resist layer then is dry etch developed using oxygen plasma as the ecthant. More specifically, during the oxygen plasma etch, oxygen interacts with the silicon in the remaining portions of the silicon containing top layer to form silicon dioxide. The silicon dioxide acts as a hard mask and protects the top surface 104 of the MOL implant layer during the etch and subsequent processing steps. Furthermore, the oxygen plasma etch, in addition to removing the exposed portions of the bottom resist layer, cleans the bottom of each trench, leaving each trench free of residue. After the oxygen plasma etch, the trench is ready for implanting without the need of a descumming step.

Figure 3:
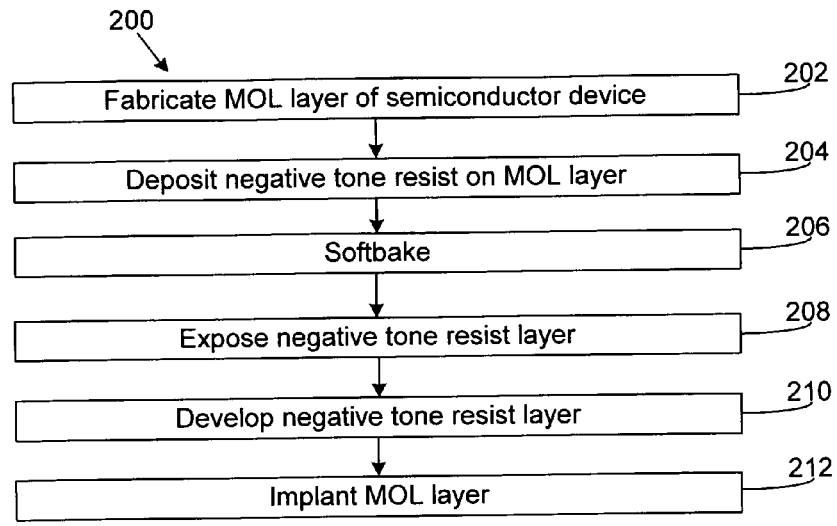
FIG. 3 is a flow chart illustrating a method of preparing an MOL implant layer of a flash memory device for implantation in accordance with an embodiment of the invention.
Figure 4A:
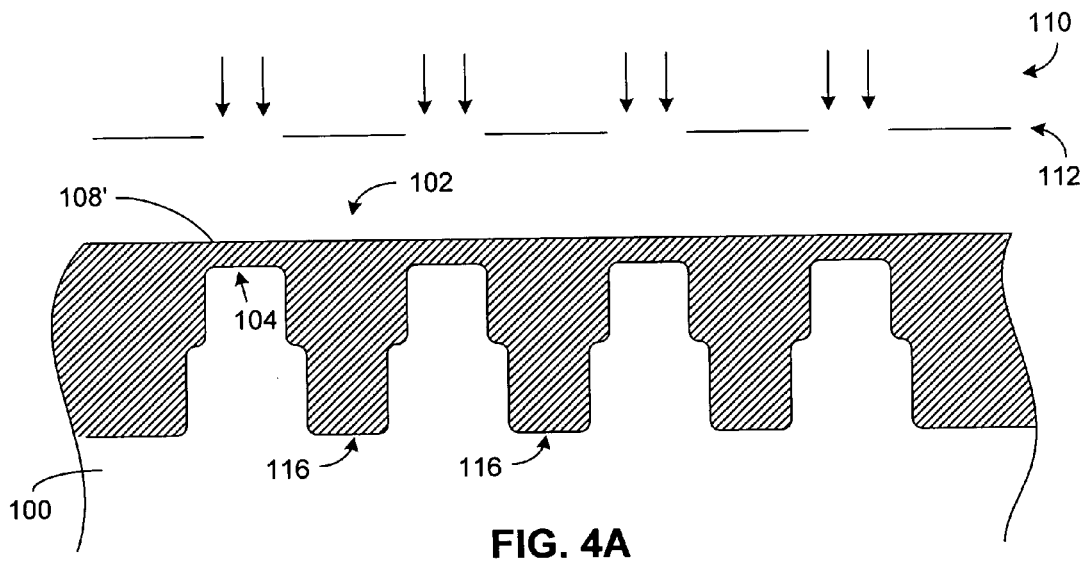
FIGS. 4A–4C are cross-sections of the MOL implant layer described in the flow chart of FIG. 3 in intermediate stages of fabrication.
Figure 4B:
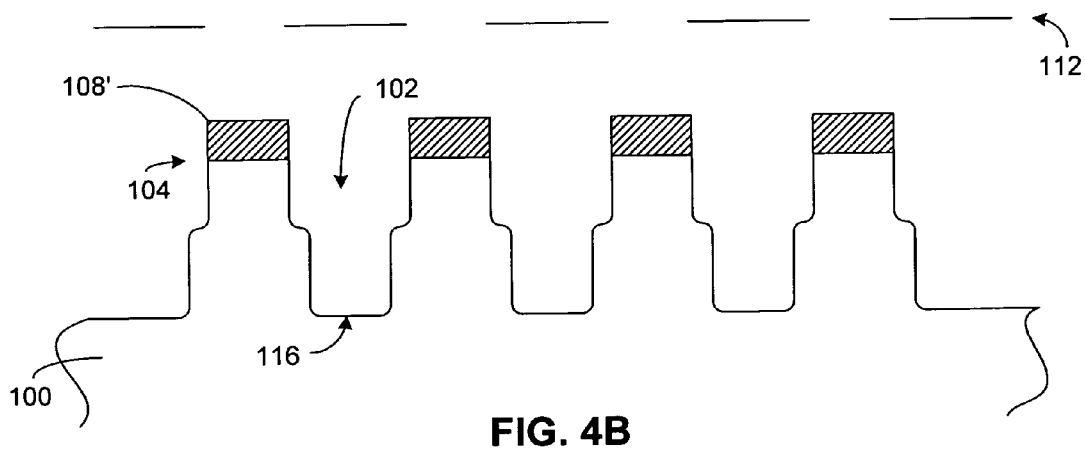
Figure 4C:
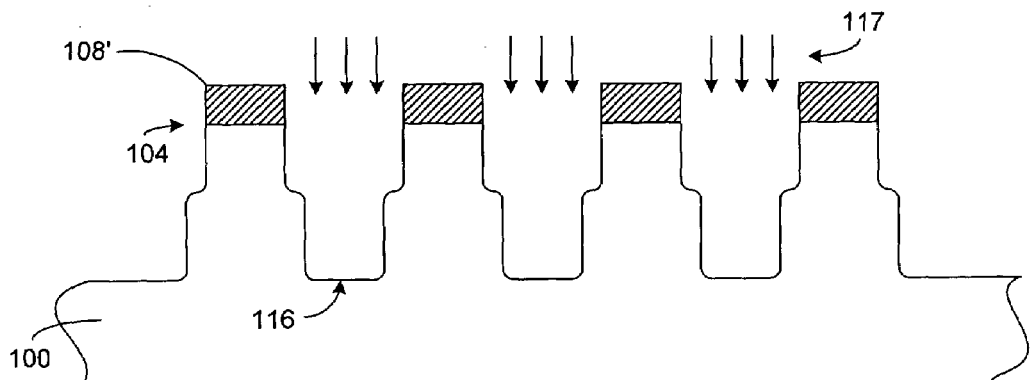

Referring now to the flow chart 200 of FIG. 3 in conjunction with FIGS. 4A–4C, exemplary processing steps for implanting a middle of line implant layer in accordance with the first embodiment of the present invention are shown. Beginning at step 202, an MOL implant layer 100 of a flash memory device is fabricated using conventional techniques. In fabricating the MOL implant layer, trenches 102 are formed in the MOL implant layer. It is noted that in all embodiments of the present invention, trenches 102 are assumed to have been formed. At step 204, a negative tone resist 108' is deposited over the MOL implant layer 100. The resist 108' can be deposited over the MOL implant layer 100, for example, by coating the surface of the wafer with a liquid resist and spinning the wafer to evenly distribute the resist over the wafer, as is conventional. A softbake is performed at step 206 to densify the resist film and drive off residual solvent.

Moving to step 208, the negative tone resist is selectively exposed to optical radiation 110. A mask 112 permits the optical radiation 110 to strike a portion of the resist 108' located above a top surface 104 of the MOL implant layer, and prevents the optical radiation from striking a portion of the resist in and above each trench 102. At step 210, the resist is developed to expose a bottom surface 116 of each trench 102. As was noted above, negative tone resists develop without leaving a residue. Thus, the bottom surface 116 of each trench 102 is residue free. Finally, at step 212, implants 117 are placed within each trench 102 using conventional techniques and, if desired, the remaining resist 108' is removed.

Accordingly, a first method for implanting an MOL implant layer of a flash memory device has been disclosed. Moreover, trench regions within the MOL implant layer are residue free and thus a descumming step need not be performed.

Figure 5:
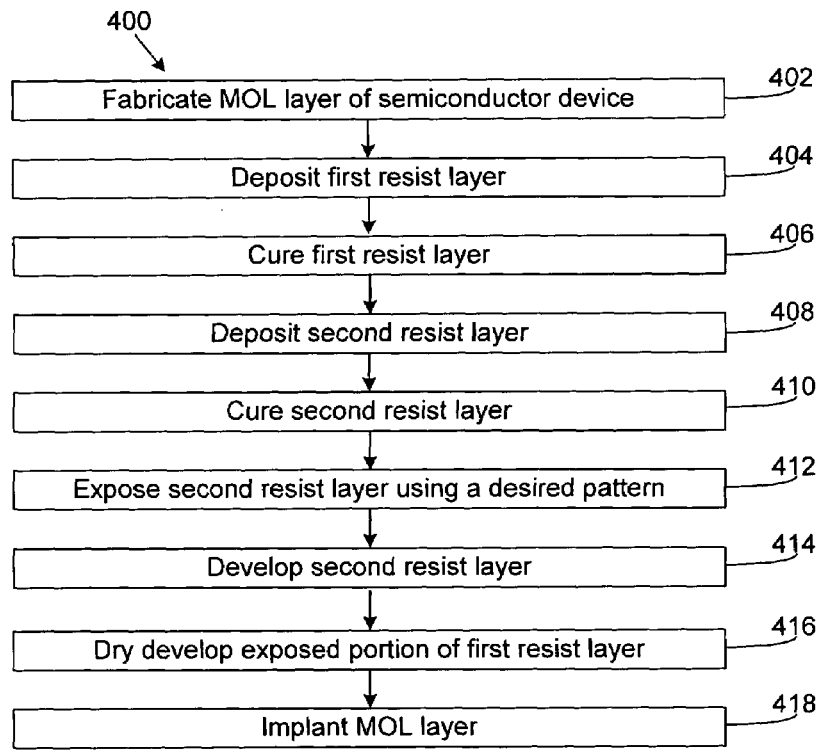
FIG. 5 is a flow chart illustrating a method of preparing an MOL implant layer of a flash memory device for implantation in accordance with another embodiment of the invention.

Referring now to the flow chart 400 of FIG. 5 in conjunction with FIGS. 6A–6F, exemplary processing steps for implanting an MOL implant layer in accordance with the second embodiment of the present invention are shown. Beginning at step 402, an MOL implant layer 100 of a flash memory device is fabricated using conventional techniques. In fabricating the MOL implant layer, trenches 102 are formed in the MOL implant layer. Next, a bi-layer resist is formed over the MOL implant layer 100. Commercially available bi-layer resists, such as SiBER™ manufactured by Shipley, LLC., can be used to form the bi-layer resist, for example.

The bi-layer resist is formed by first depositing a bottom resist layer 108" over the MOL implant layer 100, as indicated at step 404. The bottom resist layer can be formed using conventional techniques known to those skilled in the art. At step 406, the bottom resist layer 108" is cured, e.g., softbaked. After the bottom layer is cured, a silicon containing top resist layer 120 is deposited over the bottom resist layer 108" at step 408. As is known in the art, a silicon containing resist is a resist that has a high concentration of silicon therein. The silicon containing top resist layer is cured, as indicated at step 410, to complete formation of the bi-layer resist.

Figure 6A:
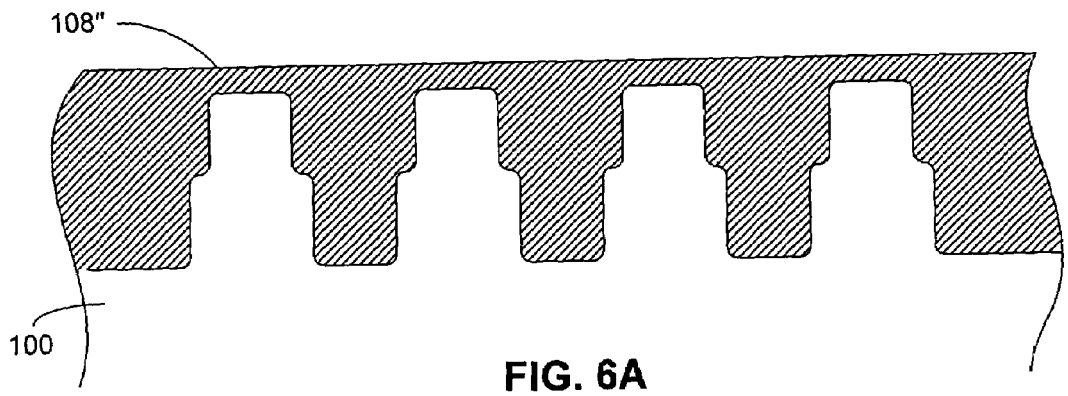
FIGS. 6A–6F are cross-sections of the MOL implant layer described in the flow chart of FIG. 5 in intermediate stages of fabrication.
Figure 6B:
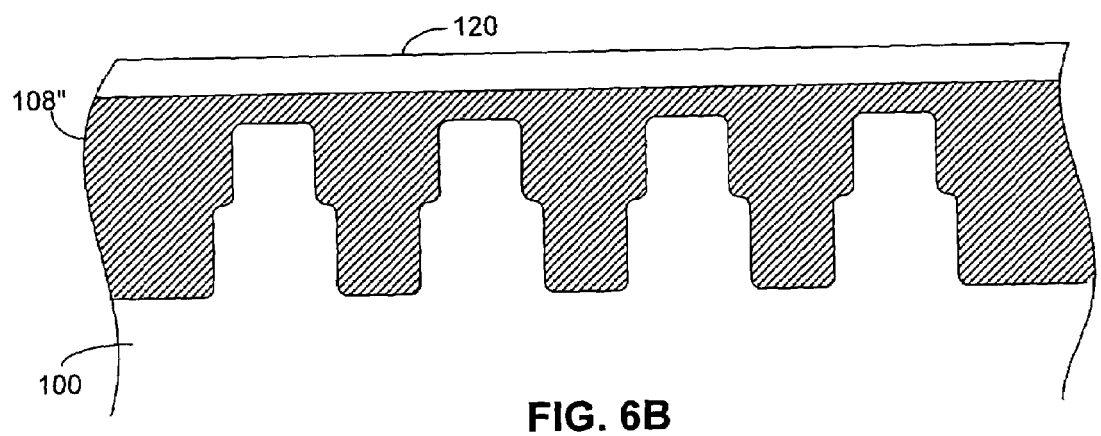
Figure 6C:
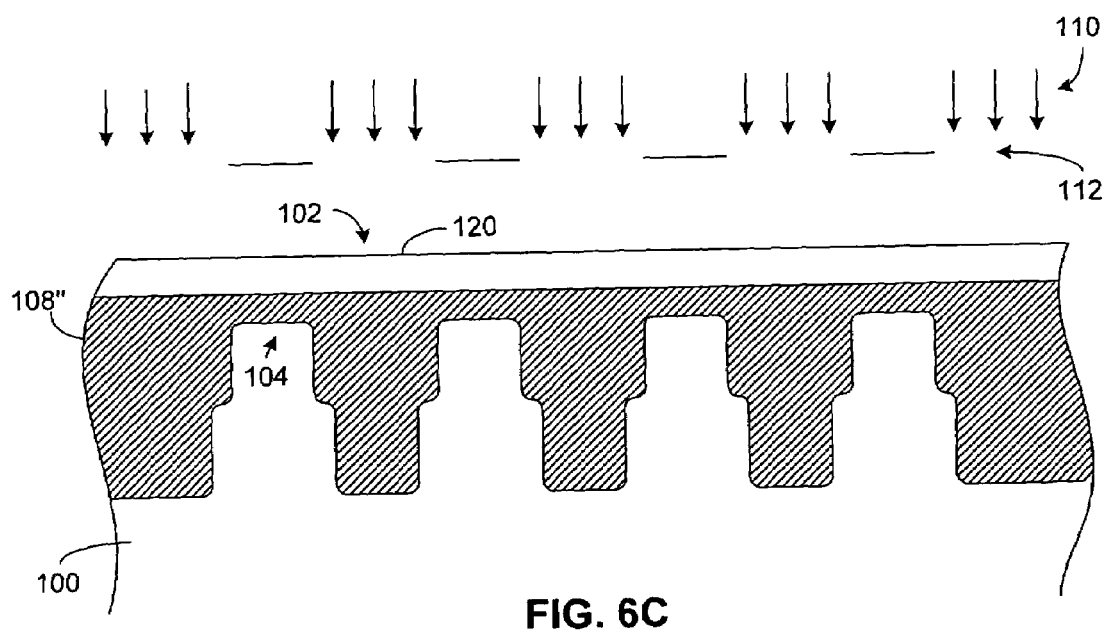
Figure 6D:
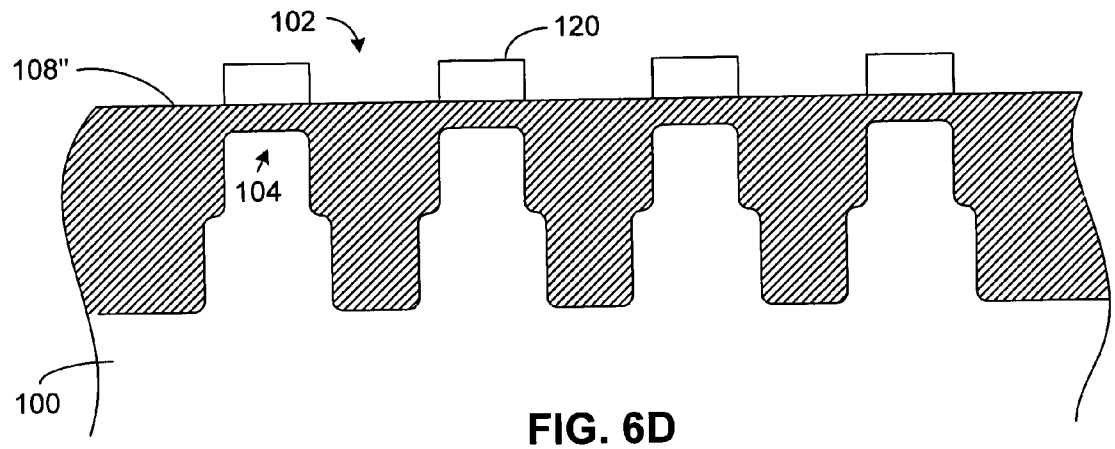
Figure 6E:
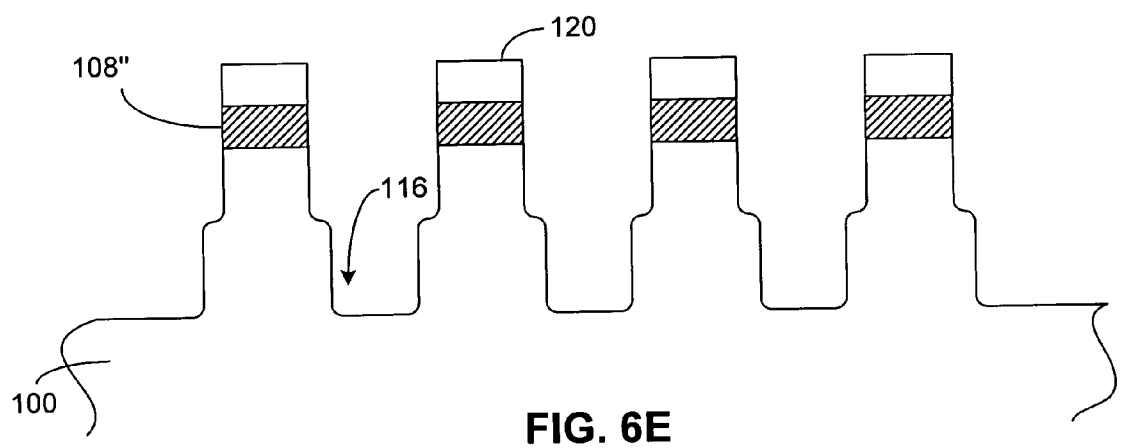
Figure 6F:
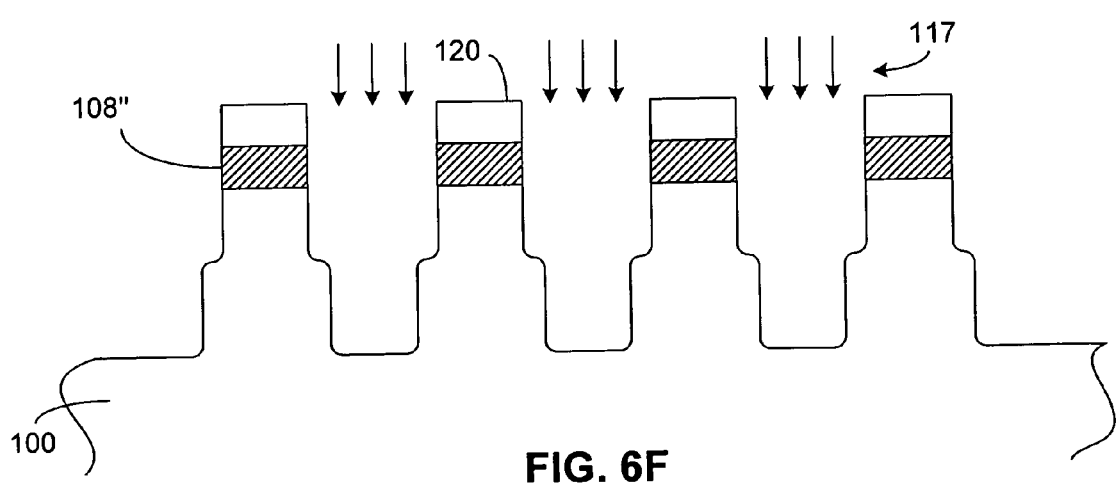

Moving to step 412, the silicon containing top resist layer 120 is selectively exposed to optical radiation 110 using a mask 112. The portions of the top resist layer 120 in and above each trench 102 are exposed to the optical radiation 110, while the portions of the resist layer 120 above the top surface 104 of the MOL implant layer 100 are not exposed to the optical radiation. At step 414 the silicon containing top resist layer 120 is developed to expose a portion of the bottom resist layer 108" in and above each trench 102, while a portion of the top resist layer 120 above a top surface 104 of the MOL implant layer 100 remains in place, as shown in FIG. 6D. At step 416, the exposed portion of the bottom resist layer 108" is dry developed using an oxygen plasma etchant. During the oxygen plasma etch, oxygen reacts with the silicon of the silicon containing top layer 120 to form silicon dioxide. The silicon dioxide layer acts as a hard mask, thereby protecting the top surface 104 of the MOL implant layer during the etch and during subsequent processing steps.

Additionally, the oxygen plasma etch removes the bottom resist layer in each trench 102. Moreover, in the process of removing the bottom resist layer 108" from each trench 102, the oxygen plasma etch cleans each trench leaving it residue free. For example, the oxygen plasma etches into a bottom portion 116 of each trench 102 thereby completely removing the bottom resist layer and any residue from each trench 102. Finally, at step 418 implants 117 are placed in each trench using conventional techniques, and then the remaining top and bottom resist layers over the top surface 1–4 of the MOL implant layer can be removed using conventional techniques.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of implanting a middle of line (MOL) implant layer of a flash memory device, comprising the steps of:
   depositing a resist layer over the MOL implant layer, wherein the resist layer is a negative tone resist;
   exposing a portion of the resist layer to optical radiation, wherein the portion exposed is over a top surface of the MOL implant layer that surrounds a plurality of trenches;
   developing the resist layer to remove the resist from the plurality of trenches, thereby leaving a bottom surface of each trench substantially free of a resist residue; and
   implanting the trenches.

2. A method of implanting a middle of line (MOL) implant layer of a flash memory device, comprising the steps of:
   depositing a bi-layer resist over the MOL implant layer, wherein the bi-layer resist includes a bottom layer and a silicon containing top layer;
   patterning the silicon containing top layer to expose a portion of the bottom layer in and above a plurality of trenches;
   dry etching the exposed portion of the bottom layer, thereby leaving a bottom surface of each trench substantially free of a resist residue; and
   implanting the trenches.

3. The method of claim 2, wherein the step of depositing the bi-layer resist over the MOL implant layer includes the steps of:
   depositing the bottom layer over the MOL layer;
   curing the bottom layer;
   depositing the silicon containing top layer over the bottom layer; and curing the top layer.

4. The method of claim 2, wherein the step of dry etching the exposed portion of the bottom layer includes the step of using an oxygen plasma etchant to dry etch the bottom layer.

5. The method of claim 4, wherein the step of using an oxygen plasma etchant to dry etch the bottom layer includes the step of forming a hard mask on a remaining portion of the silicon containing top layer.

6. The method of claim 5, wherein the step of forming a hard mask includes the step forming a hard mask via a chemical reaction between the oxygen plasma etchant and the silicon containing top layer.

7. The method of claim 2, wherein the step of depositing a bi-layer resist over the MOL implant layer includes the step of depositing a positive tone bi-layer resist.

8. The method of claim 2, wherein depositing the bi-layer resist includes depositing the bottom layer directly on the middle of line implant layer, and depositing the top layer directly on the bottom layer.

* * * * *